(12) United States Patent
Wohlfarth et al.

(10) Patent No.: US 7,057,410 B1
(45) Date of Patent: Jun. 6, 2006

(54) INTERFACE STRUCTURE FOR SEMICONDUCTOR INTEGRATED CIRCUIT TEST EQUIPMENT

(75) Inventors: Paul Dana Wohlfarth, Vernonia, OR (US); James M. Hannan, Portland, OR (US); John J. Harsany, Aloha, OR (US); James R. Jordan, Portland, OR (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 10/438,629

(22) Filed: May 14, 2003

(51) Int. Cl.
*G01R 31/28* (2006.01)

(52) U.S. Cl. ............... 324/765; 324/158.1; 324/754

(58) Field of Classification Search ........... 324/754, 324/758, 765, 158.1, 761, 757, 755; 439/482, 439/700; 438/14–18
See application file for complete search history.

(56) References Cited

U.S. PATENT DOCUMENTS

| | | | | |
|---|---|---|---|---|
| 6,166,553 A | * | 12/2000 | Sinsheimer | 324/754 |
| 6,377,062 B1 | * | 4/2002 | Ramos et al. | 324/758 |
| 6,420,888 B1 | * | 7/2002 | Griffin et al. | 324/754 |
| 6,624,646 B1 | * | 9/2003 | Zaiser | 324/754 |
| 6,744,267 B1 | * | 6/2004 | Sauk et al. | 324/754 |

* cited by examiner

*Primary Examiner*—Vinh Nguyen
*Assistant Examiner*—Jimmy Nguyen
(74) *Attorney, Agent, or Firm*—Daniel J. Bedell; Smith-Hill and Bedell (57) ABSTRACT

An interface structure for use in a semiconductor integrated circuit tester for connecting a test head interface to a DUT interface includes a first frame member having first and second opposite main faces, a second frame member having first and second opposite main faces, and a spacer securing the first and second frame members together in spaced relationship. A first cable assembly header is received in an aperture of the first frame member and includes a conductive element and electrically conductive terminal members exposed at a main face of the first frame member and electrically insulated from the conductive element of the first header. A second cable assembly header is received in an aperture of the second frame member and includes a conductive element and electrically conductive terminal members exposed at a main face of the second frame member and electrically insulated from the conductive element of the second header. Coaxial cables connect each terminal member of the first header to a corresponding terminal member of the second header.

4 Claims, 8 Drawing Sheets

FIG.12

INTERFACE STRUCTURE FOR SEMICONDUCTOR INTEGRATED CIRCUIT TEST EQUIPMENT

BACKGROUND OF THE INVENTION

This invention relates to an interface structure for semiconductor integrated circuit test equipment.

A semiconductor integrated circuit die has an array of contact pads distributed in a predetermined pattern over a major surface of the die.

Semiconductor integrated circuits may be tested at the wafer stage, prior to dicing the wafer and packaging the individual integrated circuit chips, and at the device stage, after dicing and packaging. In either case, the test equipment typically includes a test head for supplying stimulus signals to, and receiving response signals from, the device under test (DUT).

In wafer stage testing, a wafer prober positions the DUT at a test location for testing whereas for packaged device testing, a device handler is used to position the DUT for testing. For convenience in the following description it will be assumed that the DUT is in wafer form and that the test head is in the so-called DUT down orientation in which the test head is oriented to engage a DUT whose major surface is presented upwards.

Figure 1:
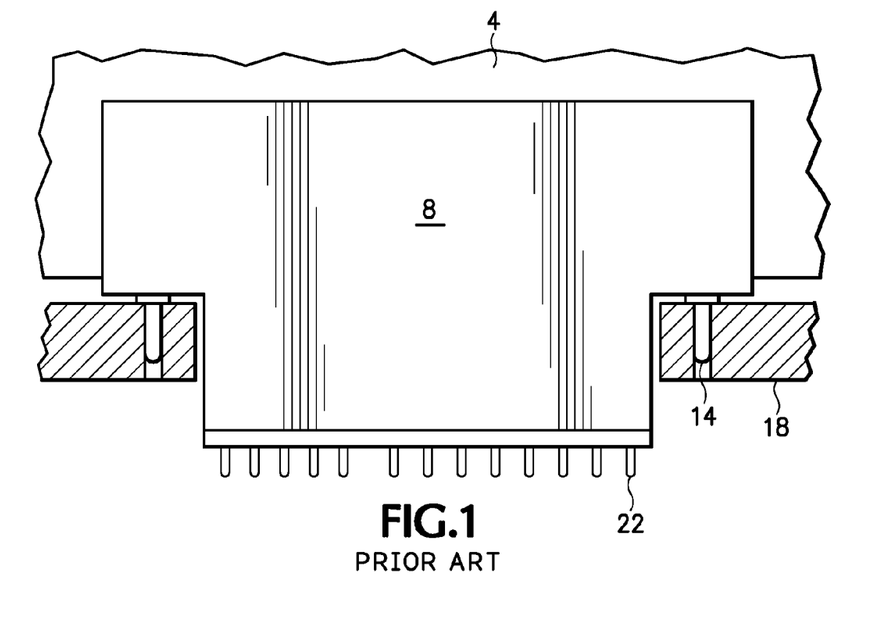
FIG. 1 is a partial schematic sectional view of a test head in accordance with the prior art.

The test head of a conventional general-purpose semiconductor integrated circuit tester includes a chassis, a docking plate attached to the chassis at the bottom of the test head, and multiple pin cards mounted in the chassis. Referring to FIG. 1, each pin card 4 is provided with a pogo block and switch module 8. Alignment pins 12 project from the module 8 and are received in alignment bores 14 of a docking plate 18 for precise positioning of the module 8 relative to the docking plate. The module 8 includes twenty-six electrical spring probe pins or contact pins 22. A suitable spring probe pin is commonly referred to as a pogo pin and includes a socket that is firmly secured in the body of the module 8, a barrel that is press fit into the socket, a plunger that is a sliding fit inside the barrel, and a spring inside the barrel urging the plunger toward a projecting position. As shown in FIG. 1, the plungers of the spring probe pins 22 project downwards beyond the docking plate.

The twenty-six spring probe pins 22 are arranged in two row of thirteen pins, and only one of these rows can be seen in FIG. 1. The thirteen pins in each row include one ground pin and eight signal I/O pins connected to the tester channel circuitry of the pin card and five auxiliary pins used for utility connections, for example for relay control. The sixteen signal I/O pins support eight or sixteen tester channels depending on tester configuration.

The spring probe pins 22 of the test head are distributed over an area that is much greater than the area of the major surface of the DUT. A prober interface structure is interposed between the spring probe pins 22 and the DUT and includes a prober interface board that is attached to the docking plate 18 and has on its upper side (the test head side) an array of pads that are engaged by the spring probe pins 22 and on its lower side (the DUT side) an array of pads distributed over an area that is smaller than the area occupied by the pads on the upper side of the prober interface board. A probe card is disposed parallel to the prober interface board and has an array of contact pads at its upper side corresponding to the array of contact pads at the lower side of the prober interface board and has probe needles projecting from its lower side for engaging the contact pads of the DUT. For reasons relating to the configuration of the conventional wafer prober, the probe card must generally be spaced by several centimeters from the prober interface board. Conventionally, this spacing is provided by a so-called pogo tower between the prober interface board and the probe card. A pogo tower typically comprises a generally cylindrical support structure and an array of double-ended spring probe pins that connect each contact pad on the lower side of the prober interface board to the corresponding contact pad on the upper side of the probe card.

During set-up of the tester, the prober interface board is positioned so that plungers of the spring probe pins 22 engage the pads on the upper side of the prober interface board and the prober interface board is then displaced towards the test head and secured to the docking plate, establishing electrically conductive pressure contact between the tip of each plunger and the respective contact pad.

The prober interface board must be manufactured with a high degree of precision to ensure that all the contact pads will remain in the correct positions, within the applicable tolerances, over the intended useful life of the board. The stringent requirements regarding the physical structure of the prober interface board result in the prober interface board being rather expensive to manufacture.

Although the test head of the conventional tester mentioned above can accommodate up to 64 pin cards, each of which may support sixteen I/O paths (for a total of 1024 I/O paths), some users of the conventional tester may require fewer than 1024 I/O paths and purchase a test head with fewer than 64 pin cards.

The conventional prober interface structure hitherto has been generally satisfactory, but as the frequencies of the signals that must be propagated between the pin cards and the probe card increases, the conventional prober interface structure approaches the limits of its performance. In particular, the I/O path should be able to propagate signals at frequencies in excess of 4 GHz with minimal cross talk and low return loss. Preferably, the signal paths should be matched in length to minimize need for deskew and to provide uniform I/O capacitance and performance. For example, the two paths that carry the two components of a differential signal should be matched in length to within about 2.5 mm. It is difficult to meet these demanding requirements in an interface structure that includes a printed circuit board of the size of a conventional probe interface board.

Another conventional prober interface structure comprises a prober interface board and a tower structure that is permanently attached to the prober interface board. The prober interface board has on its upper side an array of pads that are engaged by contact pins in the test head and the tower structure incorporates contact pins that project downwardly from the prober interface structure for engaging contact pads on the upper side of the probe card. The prober interface board has an array of pads distributed over its lower side, and each of these pads is connected to a corresponding contact pin of the tower structure by a cable that is attached at one end to the contact pad of the prober interface board and at its other end to the pogo pin of the tower structure.

SUMMARY OF THE INVENTION

In accordance with a first aspect of the invention there is provided an interface structure for use in a semiconductor integrated circuit tester for connecting a test head interface to a DUT interface, comprising a first frame member having first and second opposite main faces and defining an aperture that opens at the first and second main faces of the first frame member, a second frame member having first and second opposite main faces and defining an aperture that opens at the first and second main faces of the second frame member, a spacer securing the first and second frame members together with their second main faces in spaced confronting relationship, and a cable assembly comprising a first header received in the aperture of the first frame member and including a conductive element and a plurality of electrically conductive terminal members exposed at the first main face of the first frame member and electrically insulated from the conductive element of the first header, a second header received in the aperture of the second frame member and including a conductive element and a plurality of electrically conductive terminal members exposed at the first main face of the second frame member and electrically insulated from the conductive element of the second header, and a plurality of coaxial cables connecting each terminal member of the first header to a corresponding terminal member of the second header.

In accordance with a second aspect of the invention there is provided an interface structure for use in a semiconductor integrated circuit tester for connecting a test head interface to a DUT interface, comprising a first frame member having first and second opposite main faces, a second frame member having first and second opposite main faces, a spacer securing the first and second frame members together in substantially parallel relationship with their second main faces in spaced confronting relationship, and a plurality of flexible conductors each connected between a terminal exposed at the first main face of the first frame member and a corresponding terminal exposed at the first main face of the second frame member, and wherein the second frame member can be secured to the spacer in at least first and second different locations relative to the first frame member.

In accordance with a third aspect of the invention there is provided an interface structure for use in a semiconductor integrated circuit tester for connecting a test head interface to a DUT interface, comprising a first frame member having first and second opposite main faces, a second frame member having first and second opposite main faces, the second frame member being secured to the first frame member with the second main faces of the first and second frame members in confronting relationship, a plurality of flexible conductors each connected between a terminal exposed at the first main face of the first frame member and a corresponding terminal exposed at the first main face of the second frame member, and at least one energy storage device interposed between the first and second frame members and urging the frame members apart.

In accordance with a fourth aspect of the invention there is provided an interface structure for use in a semiconductor integrated circuit tester for connecting a test head interface to a DUT interface, comprising a first frame member having first and second opposite main faces, a second frame member having first and second opposite main faces, the second frame member being secured to the first frame member with the second main faces of the first and second frame members in confronting relationship, with the second frame member spaced from the first frame member along an axis, and in a manner allowing positively limited movement of the second frame member relative to the first frame member in directions perpendicular to said axis, and a plurality of flexible conductors each connected between a terminal exposed at the first main face of the first frame member and a corresponding terminal exposed at the first main face of the second frame member.

In accordance with a fifth aspect of the invention there is provided an interface structure for use in a semiconductor integrated circuit tester for connecting a test head interface to a DUT interface, comprising a first frame member having first and second opposite main faces and defining an aperture that opens at the first and second main faces of the first frame member, a second frame member having first and second opposite main faces and defining an aperture that opens at the first and second main faces of the second frame member, a spacer securing the first and second frame members together with their second main faces in spaced confronting relationship, and a cable assembly comprising a first header received in the aperture of the first frame member, a second header received in the aperture of the second frame member, and a plurality of compliant, elongated signal propagating elements each having a first end fitted in the first header and a second end fitted in the second header, for propagating respective signals between the first main faces of the first and second frame members.

BRIEF DESCRIPTION OF THE DRAWINGS

For a better understanding of the invention, and to show how the same may be carried into effect, reference will now be made, by way of example, to the accompanying drawings, in which.

Figure 2:
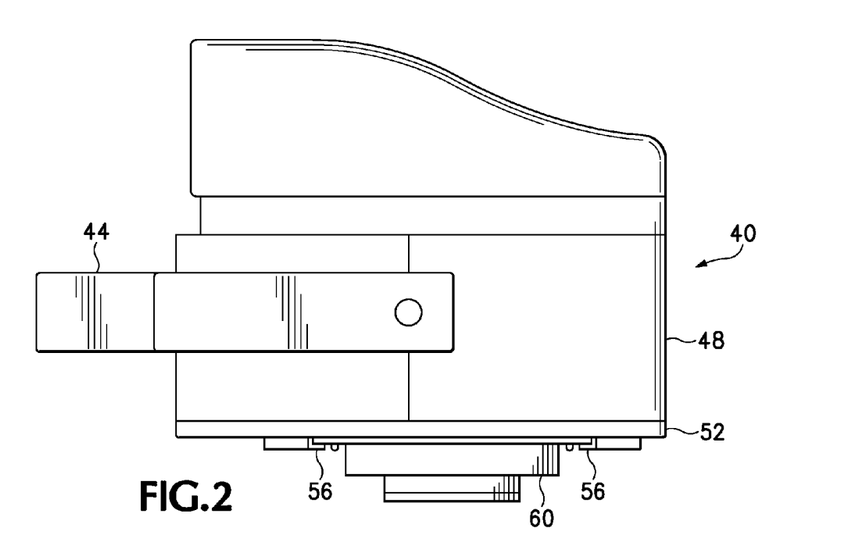
FIG. 2 is a side elevation of a test head equipped with a prober interface structure embodying the invention, the test head being shown in DUT down orientation.

Words of orientation that are used in the specification in connection with a structure or element are relative to the orientation of the structure or element when the test head is in the DUT down orientation, as shown in FIG. 2 of the drawings. It will be appreciated, however, that this is merely for convenience in description and is not intended to limit the claims.

At least one embodiment of the invention is described in detail below with reference to the drawings. For the sake of clarity and definiteness of the detailed description, the detailed description may refer to specific values or ranges of values, but it should be understood that unless the context indicates otherwise, the values are given by way of example and it is not intended that these values or ranges should limit the scope of the claims.

DETAILED DESCRIPTION

Figure 3:
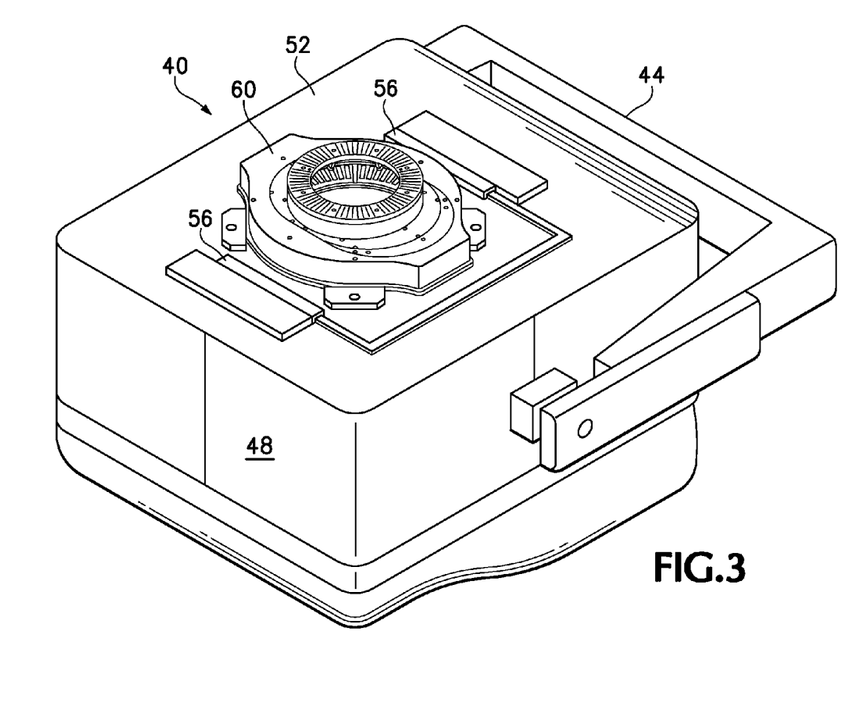
FIG. 3 is a perspective view of the test head in DUT up configuration.

FIG. 2 shows the test head 40 of a semiconductor integrated circuit tester in DUT down orientation. The test head is mounted in a yoke 44 that is attached to a test head manipulator (not shown). The manipulator and yoke allow the test head to be moved in three translational degrees of freedom and three rotational degrees of freedom. The test head includes a chassis (not shown) in which up to 64 pin cards, similar to the pin card 4 shown in FIG. 1, are mounted so that they radiate from a vertical axis. The test head 40 further includes a housing 48 surrounding the chassis and the pin cards, and a docking plate 52 attached to the chassis and provided with a docking mechanism 56 for docking the test head to a wafer prober (not shown). A prober interface structure 60, which is shown partially in FIG. 3, is attached to the test head chassis. The switch modules of the pin cards are precisely aligned relative to the docking plate 18 by alignment pins that are received in alignment bores in the docking plate (similarly to the arrangement shown in FIG. 1) and the prober interface structure is precisely aligned relative to the docking plate by alignment pins that project from the docking plate and are received in alignment bores in the interface structure. In this manner, the switch modules are precisely aligned relative to the prober interface structure 60.

Figure 4:
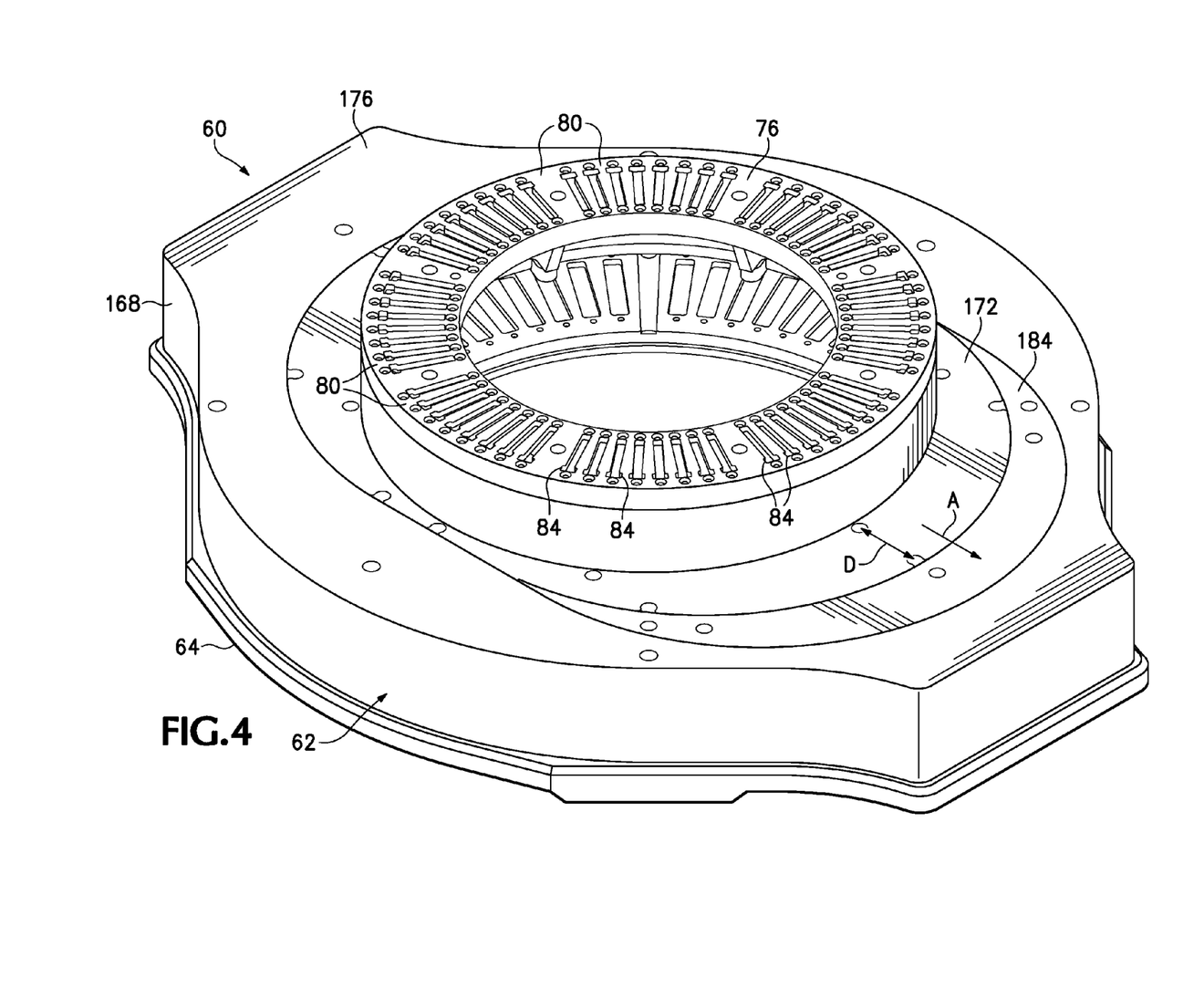
FIG. 4 is an enlarged view of the prober interface structure shown in FIGS. 2 and 3.
Figure 5:
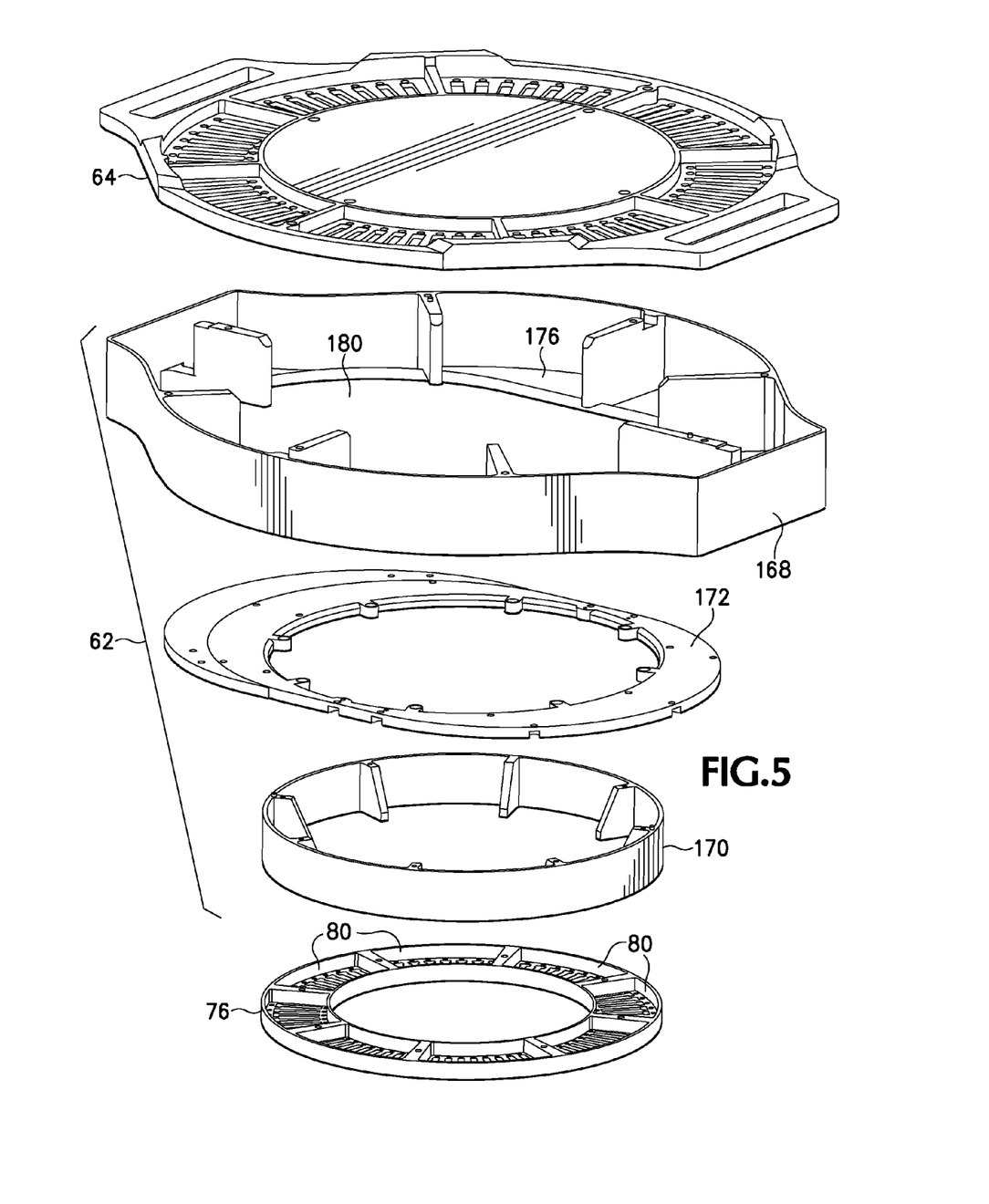
FIG. 5 is an exploded view of the prober interface structure.
Figure 6:
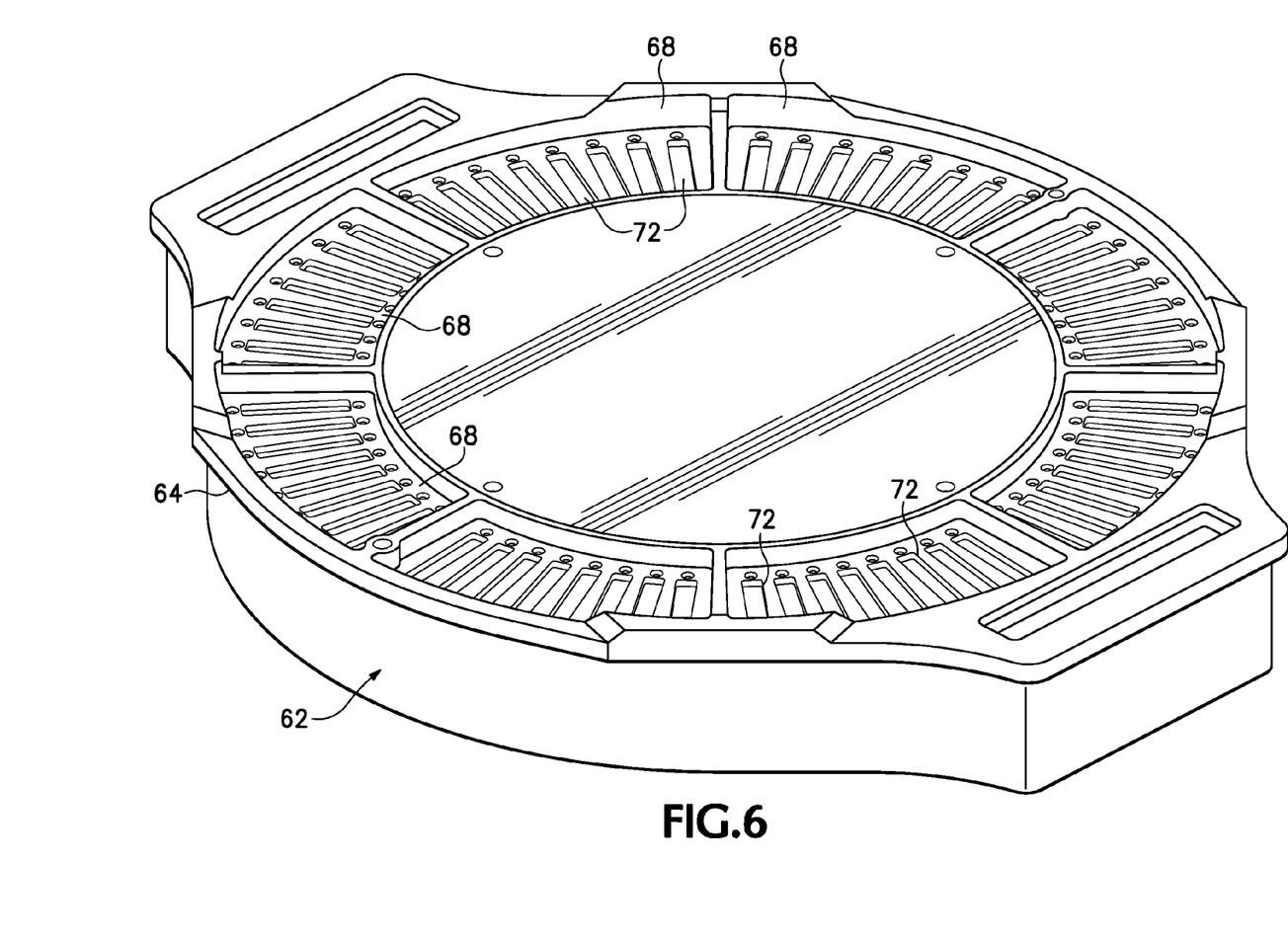
FIG. 6 is a perspective view of the prober interface structure in inverted orientation relative to FIG. 4.

Referring to FIGS. 4–6, the prober interface structure 60 comprises a multi-part body 62. An upper frame 64 that is generally annular in configuration and has eight sectors 68, each of which has eight rectangular slots 72 (FIG. 6), is attached to the body 62.

The prober interface structure includes a lower frame 76 which is generally annular in configuration but is smaller in diameter than the upper frame 64. The lower frame 76 has eight sectors 80 (FIG. 5) and each sector has eight substantially rectangular slots 84 (FIG. 4).

Figures 7, 8:
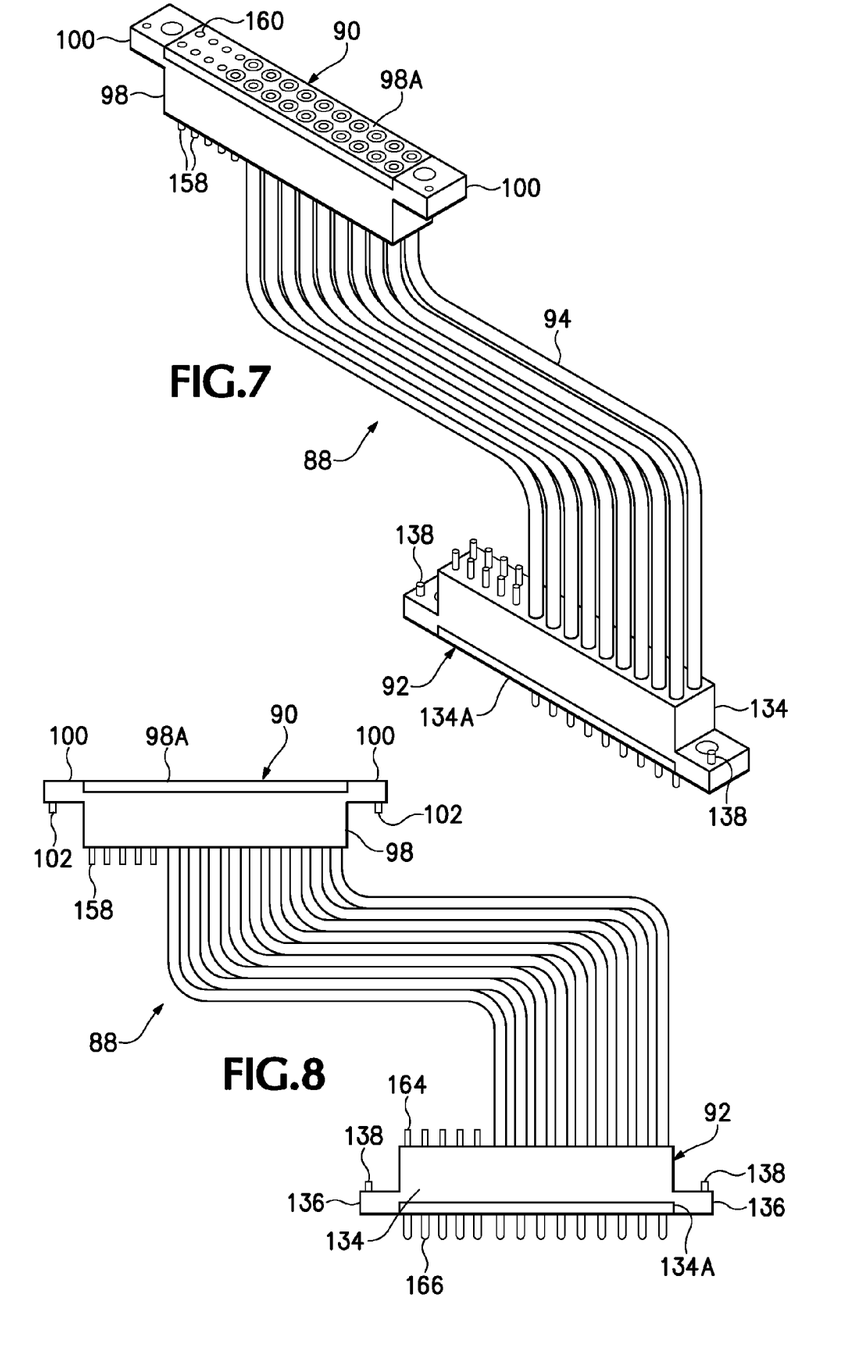
FIG. 7 is a perspective view of a cable assembly that is included in the prober interface structure.
FIG. 8 is a side elevation of the cable assembly.

The prober interface structure 60 further includes a cable assembly for each of the pin cards. Since there may be up to 64 pin cards, the prober interface structure may include up to 64 cable assemblies. The cable assemblies are not shown in FIG. 3 or in FIGS. 4–6 but one cable assembly, designated 88, is illustrated in FIGS. 7–10. Referring to FIGS. 7 and 8, the cable assembly 88 comprises an upper header 90, a lower header 92, and multiple coaxial cables 94 each attached at one end to the upper header 90 and at its opposite end to the lower header 92.

The upper header is a composite structure and comprises a dielectric body 98 and a conductive insert 98A fitted in a recess in the body 98. The upper header is dimensioned to fit in one of the slots 72 of the upper frame 64. The body 98 has two ears 100 that are formed with holes for attachment screws for attaching the upper header to the upper frame 64. Each ear is provided with an alignment pin 102 for entering an alignment bore in the frame 64 for positioning the header relative to the frame. The alignment pins 102 are asymmetrically positioned so that the header will fit in the selected slot of the upper frame 64 in only one orientation. The header 90 is also formed with multiple bores 106 (FIG. 9) for receiving the upper ends of the coaxial cables 94. The upper end of each bore is countersunk as shown at 110 to accommodate a washer 114 made of insulating dielectric material such as PTFE. A contact element 118 is placed over the washer 114 and covers the center hole of the washer.

Figure 9:
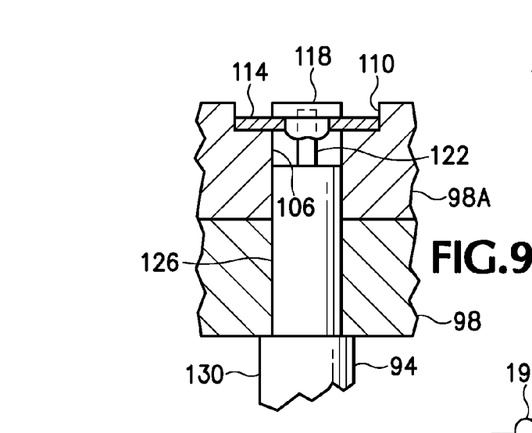
FIG. 9 is a partial enlarged view of one part of the cable assembly.

The coaxial cables are of conventional structure and each includes a center conductor 122, an insulating sleeve (not shown), typically made of PTFE, an outer shield conductor 126, and a protective outer jacket 130. The upper end of the cable is prepared by stripping the protective jacket 130 over a length slightly less than the depth of the hole 106, exposing the shield conductor 126. The shield conductor 126 and the insulating sleeve are stripped from the center conductor 122 over a small length thereof so as to expose a short stub of the center conductor, as shown in FIG. 9. The upper end of the cable is force-fit into the bore 106, or is soldered into the bore 106, in order to provide a good electrically conductive connection between the conductive insert 98A and the shield conductor 126, and the center conductor 122 is electrically connected at its upper end to the contact element 118, for example by soldering the upper end into a hole or recess at the underside of the contact element 118.

Figure 10:
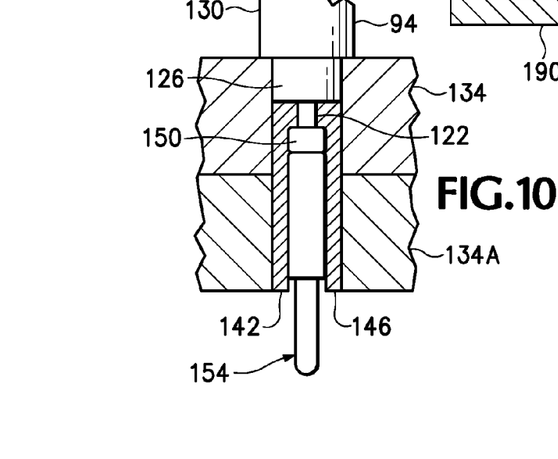
FIG. 10 is a partial enlarged view of another part of the cable assembly.

Referring to FIG. 10, the lower header 92 is dimensioned to fit in one of the slots 84 of the lower frame 76 and is a composite structure that comprises a dielectric body 134 and a conductive insert 134A fitted in a recess in the body 124. The body 134 has ears 136 and also has alignment pins 138, similar to the alignment pins 102 of the upper header 90. The lower header 92 is also formed with bores 142 for receiving the lower ends of the cables 94 respectively. The lower length segment of each bore 142 is occupied by a filler sleeve 146 of dielectric insulating material such as PTFE. The filler sleeve has an axial passage that is of substantially uniform diameter over most of its length from the lower end of the filler sleeve towards the upper end thereof but is provided with a narrow throat at its upper end. A cup-like socket 150 is a tight press fit in the wider part of the axial passage. A conventional single-ended spring probe pin 154 is also press fit into the axial passage of the sleeve 146. The barrel of the spring probe pin 154 fits firmly into the socket 150.

The lower end of the cable 94 is prepared in similar fashion to the upper end and the portion from which the protective jacket has been stripped is soldered or force-fit into the bore 142. The protruding end of the center conductor 122 is electrically connected to the socket 150, for example by soldering or crimping.

The conductive insert 134A provides a common signal ground for all the cables 94. However, should a common signal ground not be desired, the lower header 92 may be made entirely of electrically insulating material.

The cable assembly 88 can be made using conventional mass production techniques so that the length of the conductive path from the top of the contact element 118 to the tip of the spring probe pin 154 (when flush with the lower surface of the lower header) differs by an insignificant amount from a specified nominal path length. In addition, the electrical characteristics of the I/O paths employing coaxial cables are more favorable for propagation of high frequency signals than those of the conductive traces of a conventional printed circuit board.

Each cable can be tested, for example by use of time domain reflectometry, before fitting in the upper and lower headers and rejected if its electrical behavior is out of tolerance. Quality control of this nature is not possible when the conductive path is a trace on a printed circuit board. Moreover, the cables can be tested after installation in the upper and lower headers and replaced in the event of deterioration or damage.

In order to install the cable assembly 98 in the prober interface structure 60, the upper header 90 is positioned so that the main body of the header extends into the selected slot 72 and the ears 100 lie against the frame 64, and correspondingly the lower header 92 is inserted from above through the corresponding slot 84 in the lower frame 76 and is manipulated to position the ears 136 against the lower frame with the main body of the lower header extending upwards into the slot 84. The upper and lower headers are attached to the upper and lower frames respectively by screws extending through the holes in the ears of the respective headers and engaging the respective frames. The frames 64 and 76 and the headers 90 and 92 can readily be manufactured so that the upper surfaces of the headers 90 are essentially coplanar when installed in the frames 64, and similarly the lower surfaces of the headers 92 are essentially coplanar when installed in the lower frame 76.

When the prober interface structure 60 is attached to the test head and the test head is docked to the wafer prober, the lower surfaces of the headers 92 are in confronting relationship with the upper surface of the probe card. The headers 92 should be spaced from the probe card in order to reduce the capacitance between the conductive inserts 134A and the conductive traces on the upper surface of the probe card, but the spacing should be limited in order that the pogo pins should not project from the conductive inserts, and therefore be unshielded, to an excessive extent.

The switch module of the pin card also includes additional spring probe pins (not shown) that are grounded by the pin card and engage the conductive insert 98A. Since the shield conductors 126 of the coaxial cables are all electrically connected to the insert 98A, a common ground is established at the upper header for all the coaxial cables at the lower header 92.

FIGS. 7 and 8 also show several pins 158 that are connected to contact elements 160 on the upper side of the conductive insert 98A of the upper header 90 and pins 164 that are connected to spring probe pins 166 having plungers that project from the lower face of the lower header 92. Each of the pins 158 is connected to a corresponding pin 164 by a suitable flexible conductor (not shown), which may be a coaxial cable or an unshielded wire. The additional conductive paths that are provided in this manner may be used to provide utility connections between the probe card and the pin card.

The cable assemblies can be installed and removed as needed. For example, a user who initially requires a prober interface structure to support 32 pin cards can buy a prober interface structure that is populated with only 32 cable assemblies and thereby minimize the initial cost of the prober interface structure. If the user subsequently installs additional pin cards in the test head, additional cable assemblies can be installed in the prober interface structure and the investment in the original prober interface structure is preserved. If the user wishes to upgrade any or all of the I/O paths, the existing cable assemblies can be removed and replaced with assemblies manufactured to higher tolerances or with superior components without its being necessary to replace the housing. Further, if a cable assembly should be damaged, it can be replaced without requiring that any other cable assemblies be removed from the prober interface structure.

In some tester configurations, it is desirable that the lower annular frame 76 and the upper annular frame 64 should lie on a common vertical axis whereas in other configurations, it might be desirable for the central axis of the lower annular frame 76 to be offset horizontally from the central axis of the upper annular frame 64. In particular, this may be necessary to avoid interference between the test head and the wafer prober. Referring to FIGS. 3–5, the multi-part body 62 includes a main housing 168, to which the upper frame 64 is attached, a secondary housing 170, to which the lower frame 76 is attached, and an adaptor plate 172 to which the secondary housing 170 is attached. The main housing 168 includes a bottom plate 176 that defines an oblong opening 180. The adaptor plate 172 is oblong and is fitted in the oblong opening 180, the longitudinal dimension of which is somewhat greater than the corresponding dimension of the plate 172. The main housing is provided with screw holes (not shown) around the periphery of the opening 180 and the adaptor plate is provided with two sets of holes for receiving screws for attaching the adaptor plate to the main housing 168. In order to attach the adaptor plate to the housing 168, the adaptor plate 172 is placed in the oblong opening 180 and is positioned so that one of the two sets of holes in the plate 172 are aligned with the screw holes in the main housing 168, and the plate 172 is then secured to the housing 168 by screws that pass through the selected set of holes in the plate 172 and engage the screw holes in the housing 168. In this manner, the adaptor plate 172 can be attached to the main housing 168 either in the position shown in FIGS. 3 and 4 or in a position in which the plate 172 and the secondary housing 170 attached thereto are displaced relative to the main housing 168 by a distance D in the direction of the arrow A. In either case, the gap between the adaptor plate 172 and the plate 176 can be filled by a crescent-shaped filler plate 184. The different positions of the plate 172 relative to the main housing 168 are accommodated by the compliant nature of the coaxial cables. A corresponding capability is not available in the conventional tester that employs a prober interface board and a pogo tower.

Figure 11:
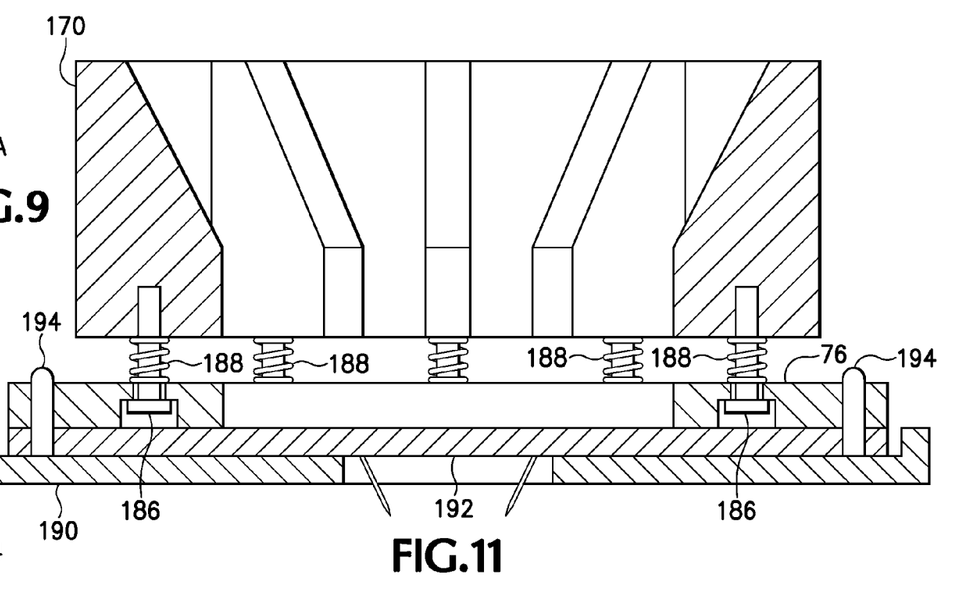
FIG. 11 is a partial sectional view of a second prober interface structure embodying the invention.

It is possible that when the test head is docked to the wafer prober, the upper surface of the probe card will not be precisely parallel to the lower surface of the frame 76. In this case, a spring probe pin in one region of the frame 76 might be fully depressed into its header 92 while the plunger of a spring probe pin in another region of the frame 76 still protrudes slightly below the lower surface of its header. It is, however, desirable with respect to the electrical characteristics of the I/O path that the spring probe pin be fully depressed, and that the plungers should not protrude below the lower surface of their headers. Referring to FIG. 11, the possibility of the lower surface of the frame 76 not being parallel with the upper surface of the probe card can be accommodated by interposing energy storage devices between the frame 76 and the housing 170. Specifically, the screws 186 that attach the frame 76 to the secondary housing 170 pass through springs 188, which for convenience are depicted as helical springs but may in fact be so-called Belville springs. The springs 188 are compressible along the common axis of the upper and lower frames, and the total force required to compress the springs 188 exceeds the total force required to compress all the spring probe pins such that the tips of the spring probe pins are flush with the lower surface of the frame 76. Accordingly, when the test head is brought into docking relationship with the prober, and actuation of the docking mechanism draws the test head towards the wafer prober, urging the probe card upwards relative to the lower frame 76, the docking force will act to compress all the spring probe pins and bring the frame 76 into parallel relationship with the probe card before the axial spring set is fully compressed.

FIG. 11 also illustrates a probe card support 190 that is attached to the wafer prober and a probe card 192 that is seated in the probe card support. Alignment pins 194 project upwardly from the probe card support and pass through bores in the probe card 192 and are received in alignment bores in the frame 76. Clearance between the frame 76 and the screws 186 allows a limited range of horizontal movement of the frame 76 relative to the secondary housing 170, which movement is accommodated by the compliant nature of the coaxial cables. By allowing limited movement of the frame 76 relative to the housing 170, it is possible to provide a high degree of precision in aligning the contact pins 154 to the pads on the probe card without requiring that the multi-part body 62 and the test head secured thereto be positioned with the same degree of precision.

Figure 12:
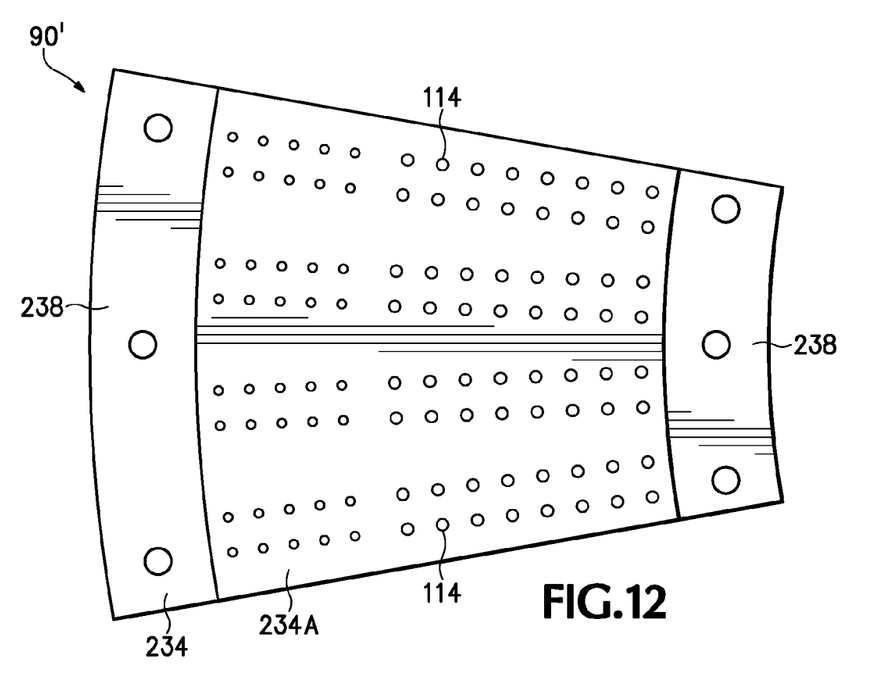
FIG. 12 is a plan view of tart of a cable assembly that may be used in another embodiment of the invention.

In the embodiment that has been described with reference to FIGS. 2–11, there is one cable assembly 88 for each pin card. Thus, each cable assembly serves a single pin card. In another embodiment of the invention, one or more of the cable assemblies serves multiple pin cards. FIG. 12 is a plan view of the upper header 90' of a cable assembly that is designed to serve four pin cards, in lieu of four of the cable assemblies 88, and it will be seen that the header 90' includes a dielectric body 234 and a conductive insert 234A fitted in a recess in the body 234. The body 23 has inner and outer flanges 238 that lie against the frame 64 when the cable assembly is installed in the prober interface structure, and the conductive insert 234A has four pairs of rows of countersunk bores accommodating respective dielectric washers 114 that contain contact elements (not shown).

It has been proposed that at least some of the signals emitted and received by an integrated circuit should be optical signals, and accordingly it is desirable to be able to test such an integrated circuit using optical stimulus and response signals. Therefore, although the invention has been described in connection with compliant propagating elements in the form of coaxial cables, which provide electrical signal paths, in its broader aspects the invention is also applicable to compliant propagating elements in the form of optical fibers, which provide optical signal paths. Even though some or all of the propagating elements for stimulus and response signals may be optical fibers, in general it will be necessary to provide compliant electrical paths between the test head interface and the DUT interface in order to supply operating power to the DUT.

It will be appreciated that the invention is not restricted to the particular embodiments that have been described, and that variations may be made therein without departing from the scope of the invention as defined in the appended claims and equivalents thereof. For example, although the illustrated embodiments of the invention have been described with reference to a prober interface structure that is attached to a test head for use in conjunction with a wafer prober for wafer stage testing, the invention is also applicable to an interface structure that is used in device stage testing. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated.

The invention claimed is:

1. An interface structure for use in a semiconductor integrated circuit tester for connecting a test head interface to a DUT interface, comprising:
    a first frame member having first and second opposite main faces,
    a second frame member having first and second opposite main faces and disposed with its second main face in substantially parallel, spaced, confronting relationship with the second main face of the first frame member,
    a first spacer member secured to the first frame member,
    a plurality of flexible conductors each connected between a terminal exposed at the first main face of the first frame member and a corresponding terminal exposed at the first main face of the second frame member, and
    a second spacer member secured to the second frame member and adapted to be secured to the first spacer member selectively in one of at least first and second different locations relative to the first spacer member,
    and wherein the first and second spacer members prevent relative movement of the first and second frame members when the second spacer member is secured to the first spacer member in either of the first and second locations,
    the first spacer member defines an oblong aperture that is symmetrical about a transverse axis,
    the second spacer member is located in the oblong aperture and has an oblong outer periphery that matches the oblong aperture defined by the first spacer member,
    and at least one of the first spacer member and the second spacer member includes formations allowing the second spacer member to be secured to the first spacer member selectively in the first location or the second locations,
    whereby when the second spacer member is secured to the first spacer member in said first location the second spacer member is located in the oblong aperture in a first orientation relative to said transverse axis and when the second spacer member is secured to the first spacer member in said second location the second spacer member is located in the oblong aperture in a second orientation relative to said transverse axis, the second orientation being different from the first orientation, and the second frame member is asymmetrical with respect to said transverse axis when the second spacer member is secured to the first spacer member in either of the first and second locations.

2. An interface structure according to claim 1, wherein the first frame member defines a first set of apertures that open at the first and second main faces of the first frame member, the second frame member defines a second set of apertures that open at the first and second main faces of the second frame member, a first header is received in an aperture of the first frame member and includes a conductive element and a plurality of electrically conductive terminal members exposed at the first main face of the first frame member and electrically insulated from the conductive element of the first header, a second header is received in an aperture of the second frame member and includes a conductive element and a plurality of electrically conductive terminal members exposed at the first main face of the second frame member and electrically insulated from the conductive element of the second header, and said flexible conductors connect each terminal member of the first header to a corresponding terminal member of the second header.

3. An interface structure according to claim 1, wherein the first frame member is substantially annular and has a central axis, the second frame member is substantially annular and has a central axis, in the first location of the second spacer member relative to the first spacer member the first and second frame members are substantially coaxial, and in the second location of the second spacer member relative to the first spacer member the central axes of the first and second frame members are parallel and the first and second frame members are not coaxial.

4. A semiconductor integrated circuit tester including a test head and an interface structure according to claim 1.

* * * * *